United States Patent [19]

Batey et al.

[11] Patent Number: 4,480,276

[45] Date of Patent: Oct. 30, 1984

[54] APPARATUS FOR PEAK DETECTION IN MAGNETIC RECORDING

[75] Inventors: Robert M. Batey, Eagle; James D. Becker, Meridian, both of Id.

[73] Assignee: Hewlett Packard Company, Palo Alto, Calif.

[21] Appl. No.: 402,507

[22] Filed: Jul. 28, 1982

[51] Int. Cl.³ .............................................. G11B 5/09
[52] U.S. Cl. ........................................ 360/46; 360/45
[58] Field of Search ............................. 360/46, 67, 45

[56] References Cited

U.S. PATENT DOCUMENTS 4,399,474  8/1983  Coleman, Jr. ........................ 360/46

Primary Examiner—Vincent P. Canney
Attorney, Agent, or Firm—Jeffery B. Fromm

[57] ABSTRACT

An apparatus is disclosed for detecting the peaks of a signal recorded on a magnetic storage medium. An absolute value circuit is used to generate an output that is approximately equivalent to the mathematical absolute value of the raw signal input from the storage medium. The absolute value signal is then coupled to both a differentiator circuit and a noise rejection comparator circuit. A second comparator which detects the zero voltage crossings of the differentiator circuit is enabled and disabled by the output from the noise rejection comparator so that transitions of opposite polarity are produced, corresponding to the peaks and positive going reference level crossings of the raw signal input, while noise on the raw signal input below a qualification level established by the noise rejection comparator circuit is rejected. The output of the second comparator is then coupled to a monostable multivibrator which produces digital pulses of a desired period which correspond to the peaks of the signal record on the magnetic storage medium.

3 Claims, 3 Drawing Figures

FIGURE 2A  TIME AXIS
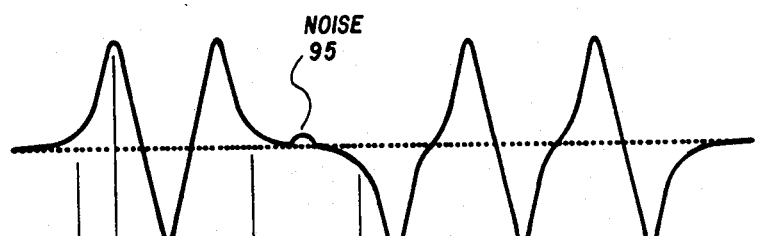
FIGURE 2B  RAW SIGNAL INPUT 90
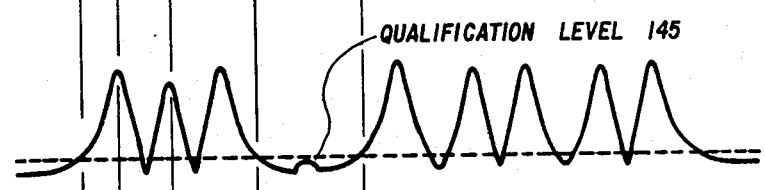
FIGURE 2C  FULL WAVE RECTIFIED SIGNAL 115
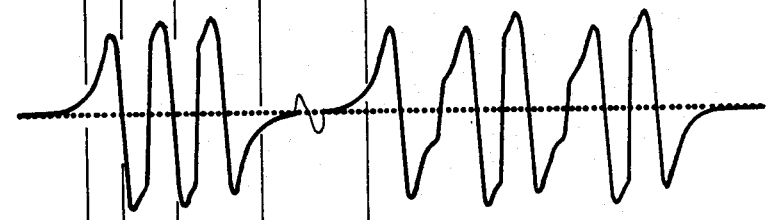
FIGURE 2D  DIFFERENTIATED SIGNAL 125
FIGURE 2E  QUALIFICATION COMPARATOR OUTPUT 135
FIGURE 2F  QUALIFIED DERIVATIVE COMPARATOR OUTPUT 165
FIGURE 2G  ONE-SHOT OUTPUT 180
FIGURE 2H  FLIP-FLOP OUTPUT 200

APPARATUS FOR PEAK DETECTION IN MAGNETIC RECORDING

BACKGROUND OF THE INVENTION

When information is written onto a magnetic disc, the information is recorded in digital form. Digital square waves have vertical edges that a magnetic head can sense. Positive and negative transitions in the square wave, that is the edges, are recognized and recorded on the magnetic medium of the disc. When the magnetic head is used to read the data stored on the disc, the output is not in digital form because of the characteristics of the head and the magnetic medium.

It is frequently desirable to locate the vertical edges of the original digital signal initially written onto the magnetic disc. Therefore, the information read from the disc must be manipulated to determine the location of the vertical edges of the original digital signal written onto the disc.

Prior solutions to recreating the vertical edges of original digital signal have concentrated on the recreation of the original digital signal itself. These methods have been based on various forms of zero-crossing detectors to indicate when the applied signal crossed a base line as explained by Batey, et al., in A Method And Means For Direct-Current Polarity Restoration In Magnetic Recording, pending U.S. patent application Ser. No. 365,661 filed Apr. 5, 1982.

However, prior solutions to locating the vertical edges of the original digital signal introduced time delays which required additional circuits for its removal or required isolated positive and negative analog signals which required careful circuit design to prevent differential timing errors.

SUMMARY OF THE INVENTION

In accordance with the present invention, a digital signal is constructed from the analog waveform read from the magnetic medium from which the vertical edges of the original prerecorded digital signal can be reconstructed. Instead of reconstructing the original prerecorded signal directly, the purpose of the present invention is to generate a signal having transitions of one polarity for the positive and negative peaks of the raw data on the magnetic disc and transitions of the opposite polarity (not used in digital data recovery) for the raw signal crossing a reference level. A single edge-triggered output circuit can then be used with this generated signal to produce a digital output signal which corresponds to the peaks of the data stored on the magnetic medium.

A single delay path for both positive and negative peaks is provided resulting in essentially zero relative timing error for either polarity of input signal. In addition, both positive and negative peaks are detected by the same slope detector thereby essentially eliminating any positive going to negative going asymmetry in the output. Finally, a qualification level is established so that noise present in the raw signal can be rejected.

DETAILED DESCRIPTION OF THE DRAWINGS

FIGS. 2A–2G are graphs which illustrate the signal waveforms in accordance with the operation of the system shown in FIG. 1.

DETAILED DESCRIPTION OF THE INVENTION

Figure 1:
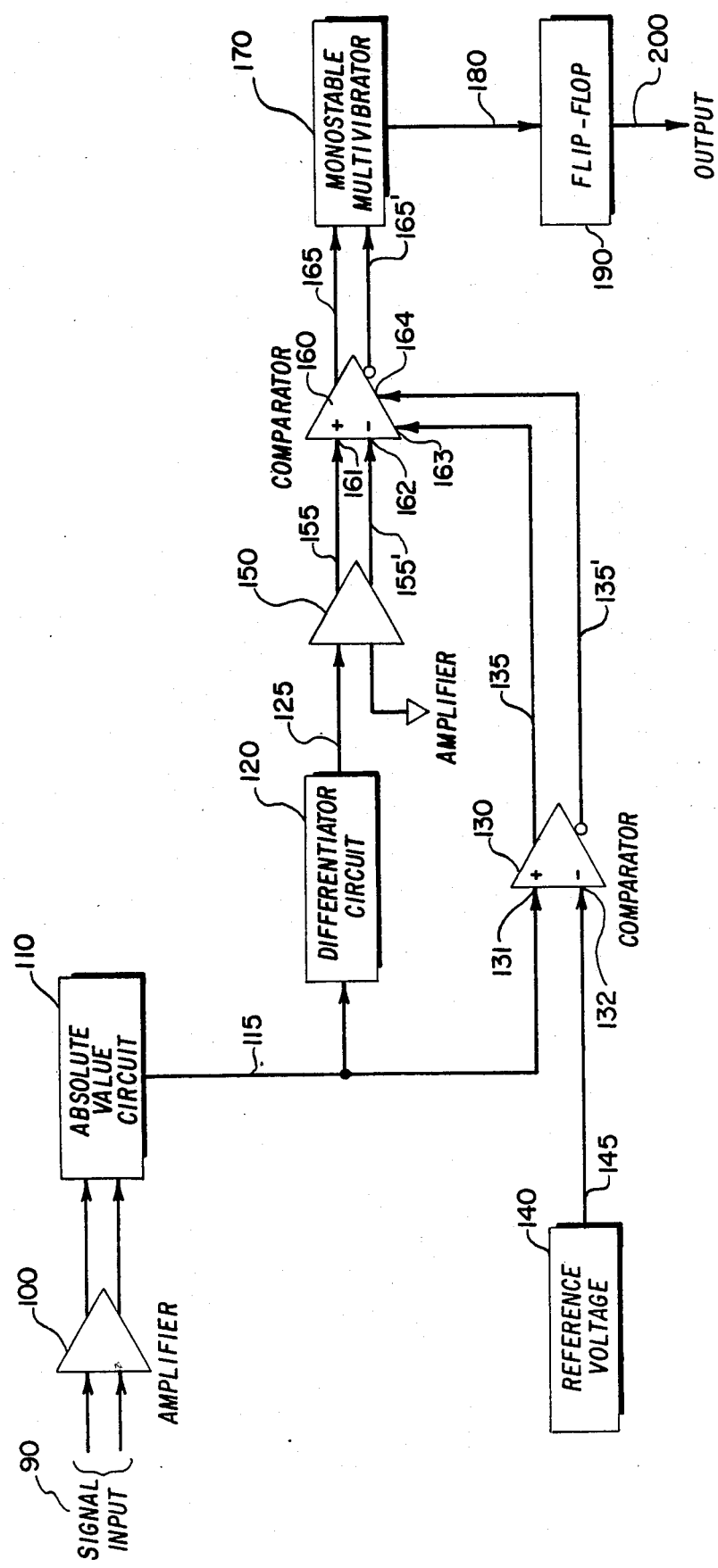
FIG. 1 is a block diagram of a system for detecting the peaks of magnetically recorded data in accordance with the preferred embodiment.

FIG. 1 is a block diagram of the elements of the system for peak detection on magnetic storage media and FIG. 2 shows the waveforms associated with FIG. 1. The raw input signal 90 from the magnetic disc is a stream of positive and negative going signals having small random noise fluctuations 95 as shown in FIG. 2B. The positive and negative peaks in FIG. 2B represent the positive and negative going edges of the original prerecorded digital signal, while the noise 95 is inadvertently introduced in many places in the recording and reading of the magnetic disc. The raw input signal 90 is passed through a buffer amplifier 100 and then to the absolute value circuit 110. The absolute value circuit 110, also known as a full-wave rectifier, generates an output 115 as shown in FIG. 2C which is approximately equivalent to the mathematical absolute value of the input signal 90. By employing an absolute value circuit 110, a single delay path can be used for both positive and negative going signals resulting in essentially zero timing errors between either polarity signal.

Output 115 drives both a differentiator circuit 120 and one input 131 of a qualification comparator 130. The differentiator circuit 120 produces an output 125 as shown in FIG. 2D which is equivalent to the time differential, d/dt, of the input signal 90. The result is that output 125 has negative going transistions corresponding to the peaks of input signal 90 and positive going transitions for the zero level crossings of input signal 90. Output 125 is then passed to a linear gain circuit 150 to restore the amplitude of the signal before further processing as signals 155 and 155'. Note that output signals 155 and 155' are the differential outputs of amplifier 150. For application where high common mode noise rejection is not required it is sufficient to use a single ended output amplifier for circuit 150.

A reference voltage 140 coupled to the second input 132 of comparator 130 is used to produce a qualification level 145 as a comparison level by the qualification comparator 130. The purpose of the qualification comparator 130 is to produce a digital signal 135 and the inverse signal 135' which can be used to discriminate between a true signal and noise on the output 115 of the absolute value circuit. As shown in FIGS. 2C and 2E, when the signal 115 exceeds the qualification level 145 the comparator outputs 135 and 135' are in one logic state, and when signal 115 is below the qualification level 145 the comparator outputs 135 and 135' are in the opposite logic state. Thus comparator 130 will reject the noise 95 as long as the noise 95 is below the qualification level 145.

The amplified differentiated signals 155 and 155' are coupled to the comparator inputs 161 and 162 respectively of the qualified derivative comparator 160 and the digital signals 135 and 135' are coupled to the enable/disable inputs 163 and 164 respectively of comparator 160. Comparator 160 will then not be responsive to signals 155 and 155' when a noise peak 95 below the qualification level 145 is present on the absolute value signal 115. When the qualified derivative comparator 160 is disabled it will hold its previous output state. The output signal 165 shown in FIG. 2F and the inverse output signal 165' of the comparator 160 thus have digital transitions of one polarity for peaks in the input signal 90 and signal 115 and digital transitions of the opposite polarity for positive going qualification level 145 crossings in signal 115.

Signal 165 and its inverse 165' are then connected to an edge triggered monostable multivibrator circuit 170, also known as a "one-shot", which is triggered only by the edges of signals 165 and 165' which corresonds to the peaks in the input signal 90. The multivibrator circuit 170 thus provides a digital output signal 180 as shown in FIG. 2G which goes high when a peak in the input signal 90 occurs, and goes low a fixed time later as set by the multivibrator circuit 170. Note that comparators 130 and 160 are shown with two outputs. For applications where high commom mode noise rejection is not a requirement single ended output comparators can be used instead.

The multivibrator circuit 170 can then be coupled to a flip-flop circuit 190 which is triggered only by the positive going edges of signal 180. The output 200 of flip-flop circuit 190, shown in FIG. 2H, will then correspond to the original prerecorded digital signal before it was written on the magnetic disc.

Figure 3:
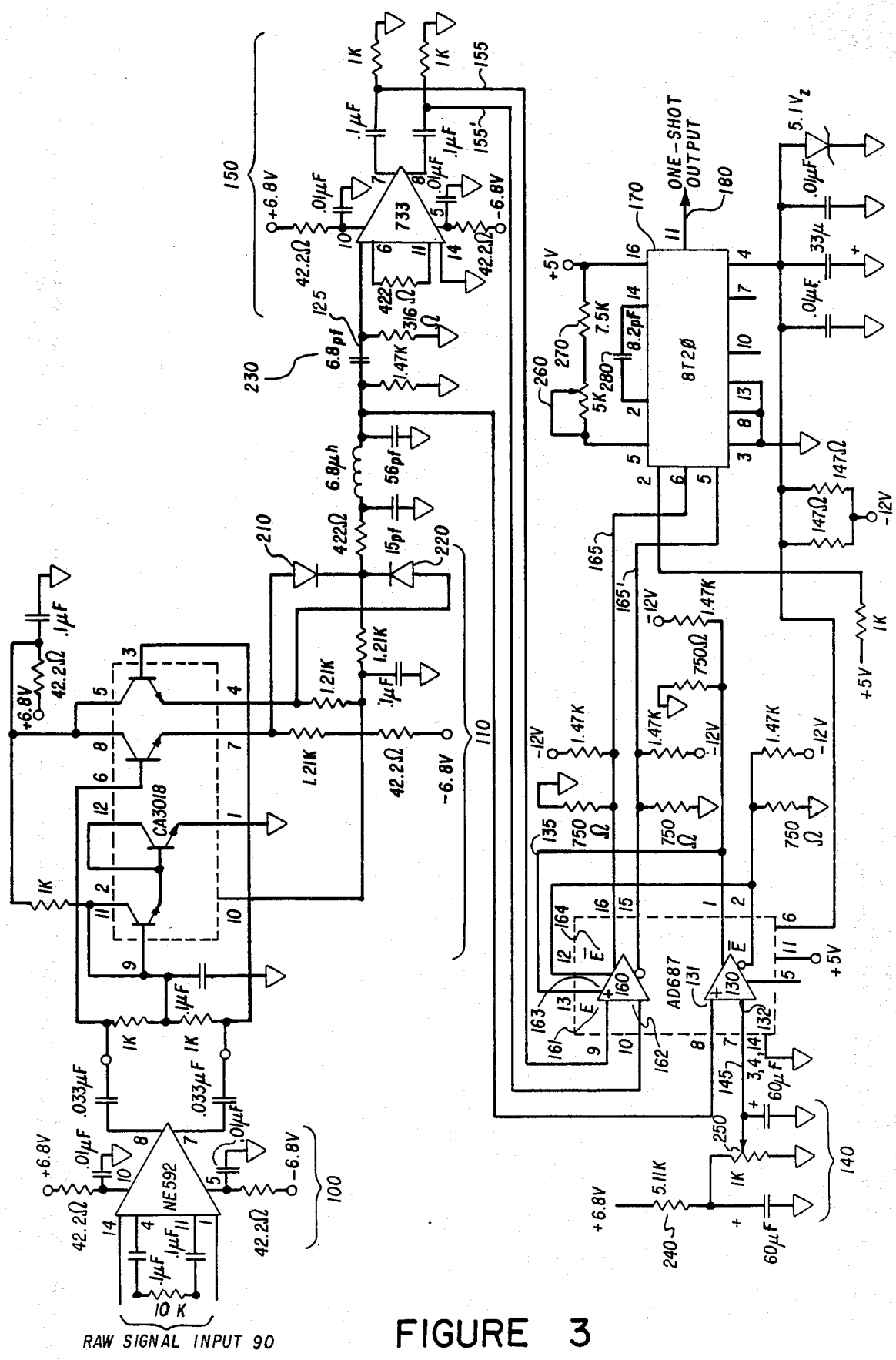
FIG. 3 is a detailed circuit diagram of peak detection system as in FIG. 1 illustrating the circuitry utilized in the preferred embodiment.

FIG. 3 is a detailed circuit diagram of the block diagram of FIG. 1 described above. Diodes 210 and 220 provide the full-wave rectifying function of the absolute value circuit 110; capacitor 230 provides the differentiation function, d/dt, of the differentiator circuit 120; resistors 240 and 250 provide the reference voltage 140; and resistors 260 and 270 with capacitor 280 provide the fixed time interval for the monostable multivibrator 170.

Therefore, the present invention produces a digital output signal 180 which corresponds to the peaks of the signal stored on the magnetic medium. This signal 180 is used to produce a reconstructed prerecorded digital signal 200. Most importantly, because there is only a single signal path for both positive and negative analog data signals 90 there is essentially zero relative timing error between the reconstructed digital signal 200 and the actual prerecord signal itself.

We claim:

1. An apparatus for locating the peaks of a signal recorded on a storage medium, said apparatus comprising:
    a first circuit means responsive to a transducer signal for providing an output signal equivalent to the mathematical absolute value of the transducer signal;
    a second circuit means coupled to the output of the absolute value circuit means for providing the time differentiation d/dt of the absolute value signal; and
    a derivative comparator means coupled to the output of the differentiation circuit means for providing an output signal of a first logic state when the output of said differentiation circuit means is positive and said comparator output means is of an opposite logic state when the output of said differentiation circuit means is negative.

2. An apparatus for locating the peaks of a signal recorded on a storage medium, said apparatus comprising:
    a first circuit means responsive to a transducer signal for providing a mathematical absolute value signal of the transducer signal;
    a second circuit means coupled to the output of the absolute value circuit means for providing the time differentiation d/dt of the absolute value signal;
    a reference voltage;
    a first comparator means having a first input coupled to said reference voltage and a second input coupled to the output of said absolute value circuit means for providing an output of a first enabling polarity when the output of the absolute value circuit means is greater than the reference voltage and said first comparator output is of an opposite disabling polarity when the output of the absolute value circuit means is less than the reference voltage; and
    a second derivative comparator means coupled to the output of said first comparator means and to the output of said differentiation circuit means so that said second derivative comparator means is enabled or disabled when the output of said first comparator means is in said first enabling or opposite disabling polarity, respectively, and said second derivative comparator means only when enabled is responsive to the output of the differentiation circuit means, said second derivative comparator means having an output having a first logic state when the output of said differentiation circuit means is positive and said second derivative comparator means output is of an opposite logic state when the output of the differentiation circuit means is negative.

3. An apparatus as in claims 1 or 2 further comprising:
    a monostable multivibrator circuit means coupled to the output of the derivative comparator means for providing an output signal responsive to only one edge of the derivative comparator means output signal.

* * * * *